United States Patent [19]

Tsukahara et al.

[11] Patent Number: 5,352,943
[45] Date of Patent: Oct. 4, 1994

[54] ECL TO GAAS LOGIC LEVEL SHIFT INTERFACE CIRCUIT

[75] Inventors: Kazuhisa Tsukahara, Yamanashi; Yoshiaki Kaneko; Maya Koyanagi, both of Kawasaki, all of Japan

[73] Assignees: Fujitsu Limited, Kawasaki; Fujitsu Quantum Devices Limited, Yamanashi, both of Japan

[21] Appl. No.: 13,641

[22] Filed: Feb. 4, 1993

[30] Foreign Application Priority Data

Feb. 6, 1992 [JP] Japan ................................. 4-021310
Feb. 3, 1993 [JP] Japan ................................. 5-016074

[51] Int. Cl.⁵ .................... H03K 19/092; H03K 17/16
[52] U.S. Cl. ..................................... 307/475; 307/443
[58] Field of Search ................ 307/475, 296.8, 443

[56] References Cited

U.S. PATENT DOCUMENTS

| | | | |
|---|---|---|---|
| 4,789,798 | 12/1988 | Lach | 307/475 |
| 5,021,691 | 6/1991 | Saito | 307/475 |
| 5,159,208 | 10/1992 | Kaneko | 307/475 |
| 5,248,909 | 9/1993 | Aoki et al. | 307/475 |

Primary Examiner—Edward P. Westin
Assistant Examiner—Richard Roseen
Attorney, Agent, or Firm—Nikaido, Marmelstein, Murray & Oram

[57] ABSTRACT

A compound semiconductor integrated circuit is adapted to provide an interface with respect to an internal circuit which is driven by first and second power source voltages and operates responsive to a logic signal having a predetermined logic level which is different from an emitter-coupled logic level. The compound semiconductor integrated circuit includes an input circuit part which is driven by the first and third power source voltages and receives an input logic signal having the emitter-coupled logic level, and an output circuit part which is driven by the first and second power source voltages and converts an output signal of the input circuit part into a signal having the predetermined logic level. The second power source voltage is lower than the first power source voltage. The third power source voltage is different from the second power source voltage and is lower than the first power source voltage. The output circuit part supplies an output thereof to the internal circuit.

12 Claims, 14 Drawing Sheets

ECL TO GAAS LOGIC LEVEL SHIFT INTERFACE CIRCUIT

BACKGROUND OF THE INVENTION

The present invention generally relates to compound semiconductor integrated circuits, and more particularly to a compound semiconductor integrated circuit such as a gallium arsenide (GaAs) integrated circuit having a built-in input interface circuit for converting an incoming logic signal of an emitter-coupled logic (ECL) level into a logic signal of a GaAs level which is used in an internal circuit which is provided at a stage subsequent to the interface circuit.

Recently, the integration density of GaAs integrated circuits has increased considerably, and thus, the GaAs integrated circuits are popularly used in applications where high speed operation and low power consumption are demanded. In such cases, there is a demand to use the GaAs integrated circuit together with the conventional ECL integrated circuit. Hence, an input interface circuit for converting the logic signal of the ECL level into the logic signal of the GaAs level is provided at the input part of the GaAs integrated circuit.

FIG. 1 shows an essential part of an example of a conventional GaAs integrated circuit having a built-in input interface circuit for converting an input logic signal of the ECL level into a logic signal of the GaAs level.

In FIG. 1, a logic signal SA having the ECL level, that is, a high level of $-1.14$ [V] and a low level of $-1.52$ [V], for example, is input to an input terminal 1. An input interface circuit 2 converts the logic signal SA of the ECL level into complementary logic signals SC and $\overline{SC}$ having the GaAs level, that is, a high level of $-0.45$ [V] and a low level of $-1.25$ [V], for example.

An internal circuit 3 is provided at a stage subsequent to the input interface circuit 2. This internal circuit 3 includes a positive phase input terminal 3A and an inverted phase input terminal 3B. An input part which is coupled to the positive and negative phase input terminals 3A and 3B has a threshold voltage of $-0.8$ [V] on the high level side and $-0.9$ [V] on the low level side, for example.

A power line 4 is set to a ground voltage GND, and a power line 5 supplies a power source voltage $V_{SS1}$ which is lower than the ground voltage GND. For example, the power source voltage $V_{SS1}$ is $-1.25$ [V]. In other words, the internal circuit 3 operates using the ground voltage GND as the power source voltage on the high voltage side, and using the power source voltage $V_{SS1}$ as the power source voltage on the low voltage side.

In the input interface circuit 2, a differential amplifier circuit 6 forms an input buffer. Power lines 7 and 8 are set to the ground voltage GND. A power line 9 supplies a power source voltage $VS_{SS2}$ which is lower than the power source voltage $V_{SS1}$. For example, the power source voltage $V_{SS2}$ is $-2.0$ [V].

It is of course possible to drive the internal circuit 3 by the same power source voltage $V_{SS2}$ which is used to drive the input interface circuit 2. However, in order to reduce the power consumption and improve the operation speed of the internal circuit 3, the power source voltage $V_{SS1}$ which is smaller in absolute value compared to the power source voltage $V_{SS2}$ is used to drive the internal circuit 3. The power source voltages $V_{SS1}$ and $V_{SS2}$ are supplied from independent power sources.

Enhancement type Schottky gate field effect transistors (hereinafter simply referred to as E-FETs) 10 and 11 are provided as driving transistors. A reference voltage $V_{ref}$ is applied to a reference voltage input terminal 12 and is supplied to E-FET 11. For example, the reference voltage $V_{ref}$ is $-1.33$ [V].

On the other hand, a depletion type Schottky gate field effect transistor (hereinafter simply referred to as D-FET) 13 forms a current source. The D-FETs 14 and 15 are used as loads.

The circuit constants of the differential amplifier circuit 6 are set so that the high level threshold voltage is $-0.9$ [V] and the low level threshold voltage is $-1.9$ [V], for example, and outputs a positive phase logic signal SB via a node 16 and an inverted phase logic signal $\overline{SB}$ via a node 17. For example, the positive and inverted phase logic signals SB and $\overline{SB}$ have a high level of 0 [V] and a low level of $-1.0$ [V].

In the input interface circuit 2, a level conversion circuit 18 converts the positive phase logic signal SB output from the differential amplifier circuit 6 into the positive phase logic signal SC having the GaAs level. This level conversion circuit 18 includes an E-FET 21 connected to a power line 19 which is set to the ground voltage GND, a diode 22, and a D-FET 23 connected to a power line 20 which supplies the power source voltage $V_{SS2}$. The positive phase logic signal SC of the GaAs level is output via a node 24.

The circuit constants of the level conversion circuit 18 are set so that the level conversion circuit 18 outputs $-0.45$ [V], for example, which is the high level of the GaAs level when the E-FET 21 is ON and outputs $-1.25$ [V], for example, which is the low level of the GaAs level when the E-FET 21 is OFF.

In addition, in the input interface circuit 2, a level conversion circuit 25 converts the inverted phase logic signal $\overline{SB}$ which is output from the differential amplifier circuit 6 into the inverted phase logic signal $\overline{SC}$ of the GaAs level. This level conversion circuit 25 includes an E-FET 28 connected to a power line 26 which is set to the ground voltage GND, a diode 29, and a D-FET 30 which is connected to a power line 27 which supplies the power source voltage $V_{SS2}$. The inverted phase logic signal $\overline{SC}$ of the GaAs level is output via a node 31.

The circuit constants of the level conversion circuit 25 are set so that the level conversion circuit 25 outputs $-0.45$ [V], for example, which is the high level of the GaAs level when the E-FET 28 is ON and outputs $-1.25$ [V], for example, which is the low level of the GaAs level when the E-FET 28 is OFF.

In the GaAs integrated circuit described above, if the logic signal SA of the ECL level input to the input terminal 1 has the high level, the E-FET 10 of the differential amplifier circuit 6 turns ON and the E-FET 11 of the differential amplifier circuit 6 turns OFF. Hence, the positive and negative phase signals SB and $\overline{SB}$ output from the differential amplifier circuit 6 respectively have the high level and the low level.

As a result, the E-FET 21 of the level conversion circuit 18 turns ON, and a signal having the high level of the GaAs level is output via the node 24. This signal output via the node 24 is supplied to the positive phase input terminal 3A of the internal circuit 3. On the other hand, the E-FET 28 of the level conversion circuit 25 turns OFF, and a signal having the low level of the GaAs level is output via the node 31. This signal output via the node 31 is supplied to the inverted phase input terminal 3B of the internal circuit 3.

On the other hand, if the logic signal SA of the ECL level input to the input terminal 1 has the low level, the E-FETs 10 and 11 of the differential amplifier circuit 6 respectively turn OFF and ON. Hence, the positive phase logic signal SB and the inverted phase logic signal $\overline{SB}$ output from the differential amplifier circuit 6 respectively have the low level and the high level.

As a result, the E-FET 21 of the level conversion circuit 18 turns OFF, and a signal having the low level of the GaAs level is output via the node 31. This signal output via the node 31 is supplied to the inverted phase input terminal 3B of the internal circuit 3.

In the conventional GaAs integrated circuit, the input interface circuit 2 and the internal circuit 3 use mutually different power source voltages on the low voltage side. For this reason, if the power source voltage $V_{SS1}$ undergoes an absolute or relative deviation with respect to the power source voltage $V_{SS2}$, the threshold voltages of the input part of the internal circuit 3 undergo an absolute or relative deviation with respect to the logic signals SC and $\overline{SC}$ which are output from the interface circuit 2. If the threshold voltages of the input part of the internal circuit 3 undergo an absolute or relative deviation with respect to the logic signals SC and $\overline{SC}$, the logic signals SC and $\overline{SC}$ output from the input interface circuit 2 cannot be transferred correctly to the internal circuit 3, and there is a problem in that an erroneous operation is generated.

FIG. 2 is a diagram for explaining the deviation of the threshold voltages of the input part of the internal circuit 3. In FIG. 2(a) shows the high level and the low level of the logic signals SC and $\overline{SC}$ which are output from the input interface circuit 2, where VOH and VOL respectively denote the high level and the low level.

On the other hand, FIG. 2(b) shows the threshold voltages of the input part of the internal circuit 3 for the case where the power source voltage $V_{SS1}$ undergoes no absolute or relative deviation with respect to the power source voltage $V_{SS2}$, where VIH and VIL respectively denote the high level and the low level of the threshold voltages. In this case, VOH>VIH and VOL<VIL. Hence, the input part of the internal circuit 3 can accurately judge the high and low levels of the signals output from the input interface circuit 2.

In FIG. 2(c) shows an example of a deviation in the threshold voltages of the input part of the internal circuit 3 for the case where the power source voltage $V_{SS1}$ undergoes an absolute or relative deviation in the negative direction with respect to the power source voltage $V_{SS2}$, where VIH' and VIL' respectively denote the threshold voltages for the high level and the low level. Since VOL>VIL' in this case, the input part of the internal circuit 3 cannot judge the low level of the signals which are output from the input interface circuit 2.

In addition, in FIG. 2(d) shows an example of a deviation in the threshold voltages of the input part of the internal circuit 3 for the case where the power source voltage $V_{SS1}$ undergoes an absolute or relative deviation in the positive direction with respect to the power source voltage $V_{SS2}$, where VIH" and VIL" respectively denote the threshold voltages for the high level and the low level. Since VOH<VIH" in this case, the input part of the internal circuit 3 cannot judge the high level of the signals which are output from the input interface circuit 2.

SUMMARY OF THE INVENTION

Accordingly, it is a general object of the present invention to provide a novel and useful compound semiconductor integrated circuit in which the problems described above are eliminated.

Another and more specific object of the present invention is to provide a compound semiconductor integrated circuit adapted to provide an interface with respect to an internal circuit which is driven by first and second power source voltages and operates responsive to a logic signal having a predetermined logic level which is different from an emitter-coupled logic level, comprising an input terminal for receiving an input logic signal having the emitter-coupled logic level, input circuit means, coupled to the input terminal and driven by the first and third power source voltages, for receiving the input logic signal via the input terminal, and output circuit means, coupled to the input circuit means and driven by the first and second power source voltages, for converting an output signal of the input circuit means into a signal having the predetermined logic level, where the second power source voltage is lower than the first power source voltage, the third power source voltage is different from the second power source voltage and is lower than the first power source voltage, and the output circuit means supplies an output thereof to the internal circuit. According to the compound semiconductor integrated circuit of the present invention, it is possible to correctly transfer the logic level of the input logic signal to the internal circuit even if a relative deviation occurs in a difference between the second and third power source voltages. As a result, it is possible to prevent an erroneous operation of the internal circuit.

Other objects and further features of the present invention will be apparent from the following detailed description when read in conjunction with the accompanying drawings.

DESCRIPTION OF THE PREFERRED EMBODIMENTS

First, a description will be given of the operating principle of the present invention, by referring to FIG. 3.

Figure 3:
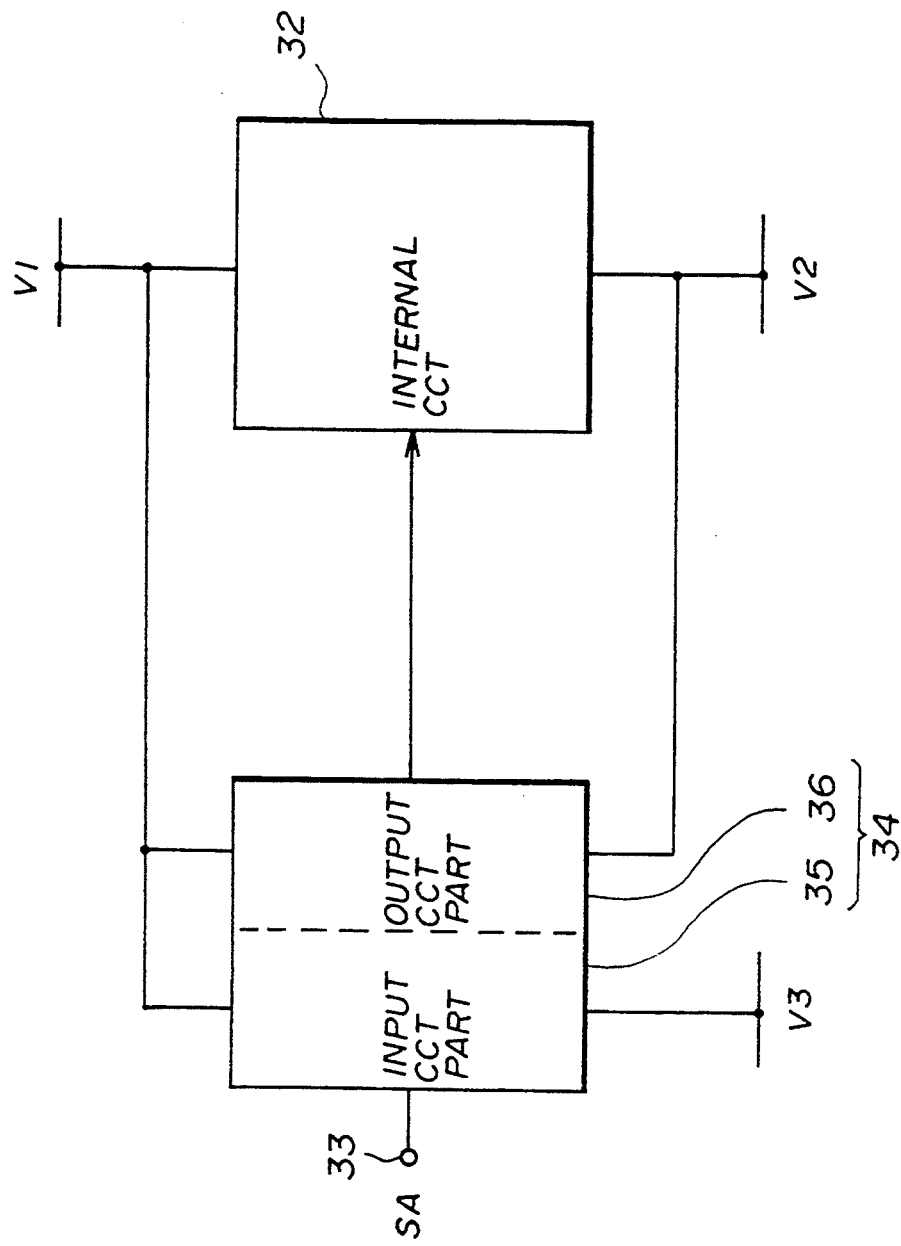
FIG. 3 is a system block diagram for explaining the operating principle of the present invention.

In FIG. 3, an input interface circuit 34 includes an input circuit part 35 and an output circuit part 36. This input interface circuit 34 is coupled to an internal circuit 32. The internal circuit 32 operates with logic signals having levels different from the ECL level which is used in the input interface circuit 34. The input interface circuit 34 and the internal circuit 32 may be provided on a single semiconductor chip.

The input and output circuit parts 35 and 36 of the input interface circuit 34 and the internal circuit 32 are coupled to a power line which supplies a power source voltage V1. The internal circuit 32 is also coupled to a power line which supplies a power source voltage V2 which is lower than the power source voltage V1. In other words, the power source voltage V1 is on the high voltage side, and the power source voltage V2 is on the low voltage side.

The input circuit part 35 of the input interface circuit 34 is also coupled to a power line which supplies a power source voltage V3, and the output circuit part 36 of the input interface circuit 34 is also coupled to the power line which supplies the power source voltage V2. The input interface circuit 34 uses the power source voltage V1 as power source voltage on the high voltage side, and the power source voltage V3 which is lower than the power source voltage V1 as the power source voltage on the low voltage side.

Unlike the internal circuit 32, the input circuit part 35 of the input interface circuit 34 operates using the power source voltage V3 as the power source voltage on the low voltage side. But the output circuit part of the input interface circuit 34 uses the power source voltage V1 as the power source voltage on the high voltage side and the power source voltage V2 as the power source voltage on the low voltage side, similarly as in the case of the internal circuit 32.

As a result, even if the power source voltage undergoes a deviation, the logic signals output from the input interface circuit 34 and the threshold voltages of the input part of the internal circuit 32 shift in the same direction.

Therefore, according to the present invention, it is possible to correctly transfer the logic signals output from the input interface circuit 34 to the internal circuit 32 even if the power source voltage deviates. Hence, it is possible to avoid an erroneous operation which is caused by incorrect transfer of the logic signals output from the input interface circuit 34 to the internal circuit 32.

Figure 1:
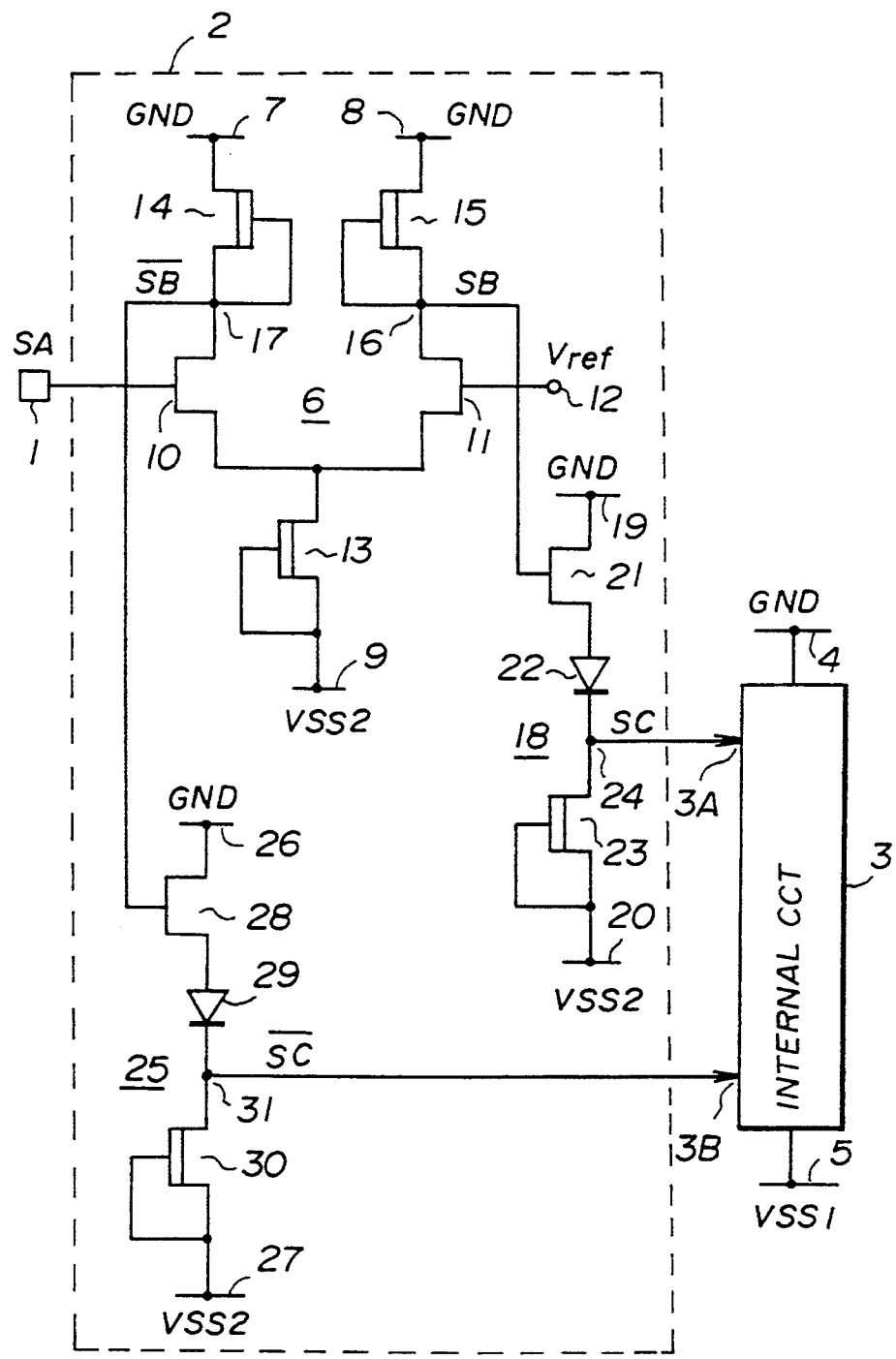
FIG. 1 is a circuit diagram showing an essential part of an example of a conventional GaAs integrated circuit.
Figure 2:
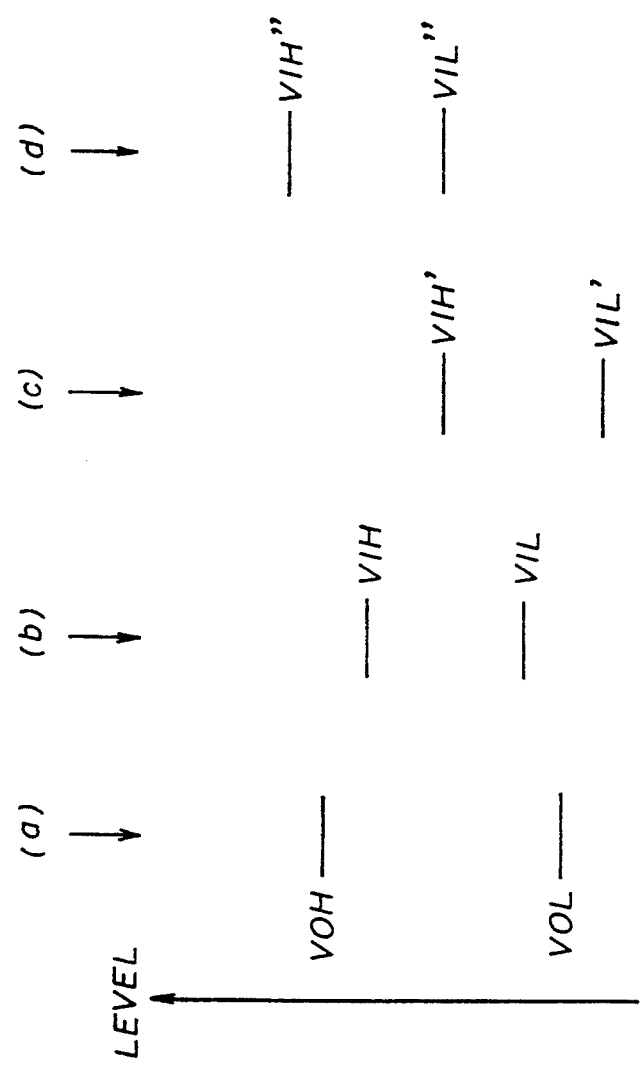
FIG. 2 is a diagram for explaining a deviation in threshold voltages of an input part of an internal circuit shown in FIG. 1.
Figure 4:
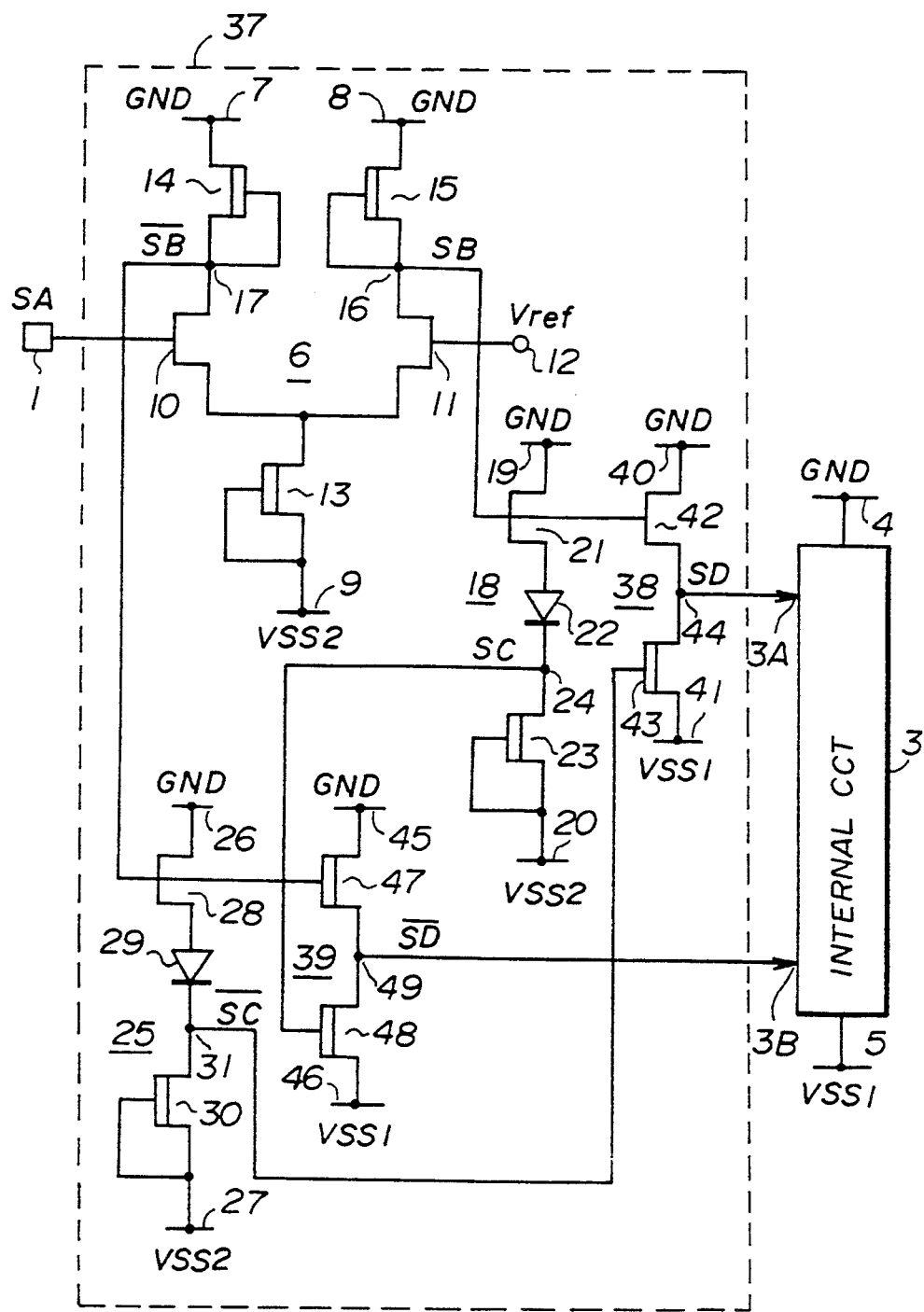
FIG. 4 is a circuit diagram showing an essential part of a first embodiment of a compound semiconductor integrated circuit according to the present invention.

Next, a description will be given of a first embodiment of a compound semiconductor integrated circuit according to the present invention, by referring to FIGS. 4 through 9. In FIG. 4, those parts which are the same as those corresponding parts in FIG. 1 are designated by the same reference numerals, and a description thereof will be omitted.

FIG. 4 shows an essential part of the first embodiment. In this embodiment, an input circuit part of an input interface circuit 37 includes a differential amplifier circuit 6, and level conversion circuits 18 and 25. An output circuit part of the input interface circuit 37 includes push-pull circuits 38 and 39. The push-pull circuits 38 and 39 are respectively connected between the level conversion circuit 18 and a positive phase input terminal 3A of an internal circuit 3 and between the level conversion circuit 25 and an inverted phase input terminal 3B of the internal circuit 3. Otherwise, this embodiment is constructed similarly to the conventional GaAs integrated circuit shown in FIG. 1.

The push-pull circuit 38 outputs a positive phase logic signal SD of the GaAs level. In FIG. 4, a power line 40 is set to the ground voltage GND, and a power line 41 supplies the power source voltage $V_{SS1}$. The push-pull circuit 38 includes an E-FET 42 and a D-FET 43, and the drain of the E-FET 42 is connected to the power line 40 which is set to the ground voltage GND. The gate of the E-FET 42 is connected to a node 16 of the differential amplifier circuit 6.

On the other hand, the D-FET 43 has its drain connected to the source of the E-FET 42, its gate connected to a node 31 of the level conversion circuit 25, and its source connected to the power line 41. A node 44 which connects the source of the E-FET 42 and the drain of the D-FET 43 is connected to the positive phase input terminal 3A of the internal circuit 3.

The circuit constants of the push-pull circuit 38 are set so that a high level of the GaAs level, that is, −0.45 [V], for example, is output via the node 44 when the E-FET 42 and the D-FET 43 are respectively turned ON and OFF, and a low level of the GaAs level, that is, −1.25 [V], for example, is output via the node 44 when the E-FET 42 and the D-FET 43 are respectively turned OFF and ON.

The push-pull circuit 39 outputs an inverted phase logic signal $\overline{SD}$ of the GaAs level. In FIG. 4, a power line 45 is set to the ground voltage GND, and a power line 46 supplies the power source voltage $V_{SS1}$. The push-pull circuit 39 includes an E-FET 47 and a D-FET 48, and the drain of the E-FET 47 is connected to the power line 45 which is set to the ground voltage GND.

The gate of the E-FET 47 is connected to a node 17 of the differential amplifier circuit 6.

On the other hand, the D-FET 48 has its drain connected to the source of the E-FET 47, its gate connected to a node 24 of the level conversion circuit 18, and its source connected to the power line 46. A node 49 which connects the source of the E-FET 47 and the drain of the D-FET 48 is connected to the inverted phase input terminal 3B of the internal circuit 3.

The circuit constants of the push-pull circuit 39 are set so that a high level of the GaAs level, that is, −0.45 [V], for example, is output via the node 49 when the E-FET 47 and the D-FET 48 are respectively turned ON and OFF, and a low level of the GaAs level, that is, −1.25 [V], for example, is output via the node 49 when the E-FET 47 and the D-FET 48 are respectively turned OFF and ON.

In this embodiment, if the logic signal SA of the ECL level input to the input terminal 1 has the high level, the E-FETs 10 and 11 of the differential amplifier circuit 6 respectively turn ON and OFF, and the positive and inverted phase output signals SB and $\overline{SB}$ respectively have the high level and the low level. As a result, the E-FET 21 of the level conversion circuit 18 turns ON, and a high-level signal having the voltage $V_{SS1}$, for example, is output via the node 24. On the other hand, the E-FET 28 of the level conversion circuit 25 turns OFF, and a low-level signal having the voltage $V_{SS2}$, for example, is output via the node 31.

Hence, in the push-pull circuit 38, the E-FET 42 turns ON, the D-FET 43 turns OFF, and a high-level signal of the GaAs level is output via the node 44. In the push-pull circuit 39, the E-FET 47 turns OFF, the D-FET 48 turns ON, and a low-level signal of the GaAs level is output via the node 49.

On the other hand, if the logic signal SA of the ECL level input to the input terminal 1 has the low level, the E-FETs 10 and 11 of the differential amplifier circuit 6 respectively turn OFF and ON, and the positive and inverted phase output signals SB and $\overline{SB}$ respectively have the low level and the high level. As a result, the E-FET 21 of the level conversion circuit 18 turns OFF, and a low-level signal having the voltage $V_{SS2}$, for example, is output via the node 24. On the other hand, the E-FET 28 of the level conversion circuit 25 turns ON, and a high-level signal having the voltage $V_{SS1}$, for example, is output via the node 31.

Hence, in the push-pull circuit 38, the E-FET 42 turns OFF, the D-FET 43 turns ON, and a low-level signal of the GaAs level is output via the node 44. In the push-pull circuit 39, the E-FET 47 turns ON, the D-FET 48 turns OFF, and a high-level signal of the GaAs level is output via the node 49.

In this embodiment, the differential amplifier circuit 6 and the level conversion circuits 18 and 25 which form the input circuit part of the input interface circuit 37 are designed to operate using the ground voltage GND as the power source voltage on the high voltage side and the power source voltage $V_{SS2}$ as the power source voltage on the low voltage side. But the push-pull circuits 38 and 39 which form the output circuit part of the input interface circuit 37 are designed to operate using the ground voltage GND as the power source voltage on the high voltage side and the power source voltage $V_{SS1}$ as the power source voltage on the low voltage side, similarly as in the case of the internal circuit 3.

Figure 5:
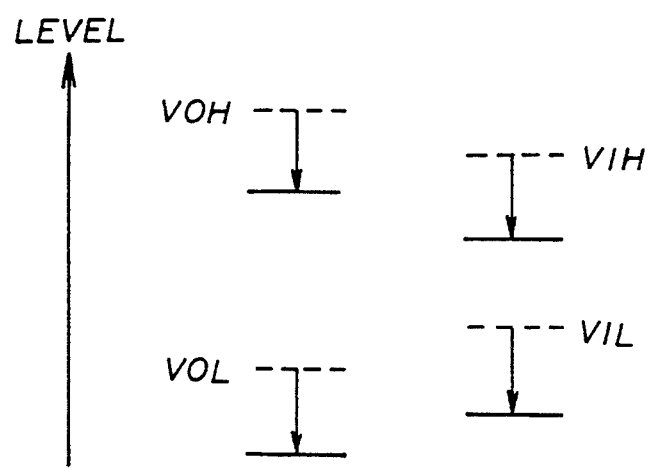
FIGS. 5 and 6 respectively are diagrams for explaining the relationship of high and low levels of logic signals output from an input interface circuit of the first embodiment and threshold voltages of an input part of an internal circuit of the first embodiment.

For this reason, if the power source voltage $V_{SS1}$ undergoes an absolute or relative deviation in the negative direction with respect to the power source voltage $V_{SS2}$, the high-level voltage VOH and the low-level voltage VOL of the logic signals SD and $\overline{SD}$ output from the input interface circuit 37 and the threshold voltages VIH and VIL of the input part of the internal circuit 3 respectively shift in the negative direction as shown in FIG. 5.

Figure 6:
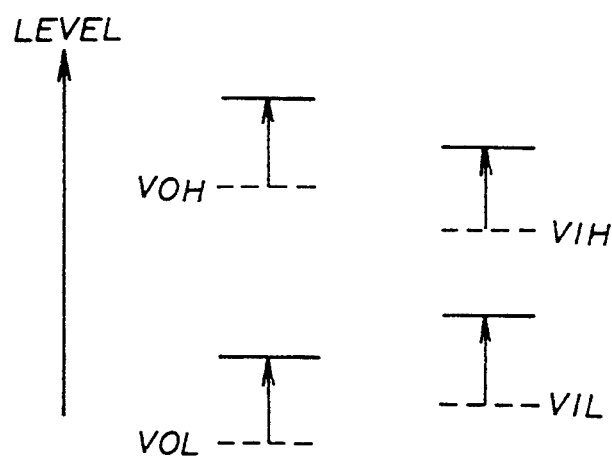

In addition, if the power source voltage $V_{SS1}$ undergoes an absolute or relative deviation in the positive direction with respect to the power source voltage $V_{SS2}$, the high-level voltage VOH and the low-level voltage VOL of the logic signals SD and $\overline{SD}$ output from the input interface circuit 37 and the threshold voltages VIH and VIL of the input part of the internal circuit 3 respectively shift in the positive direction as shown in FIG. 6.

Figure 7:
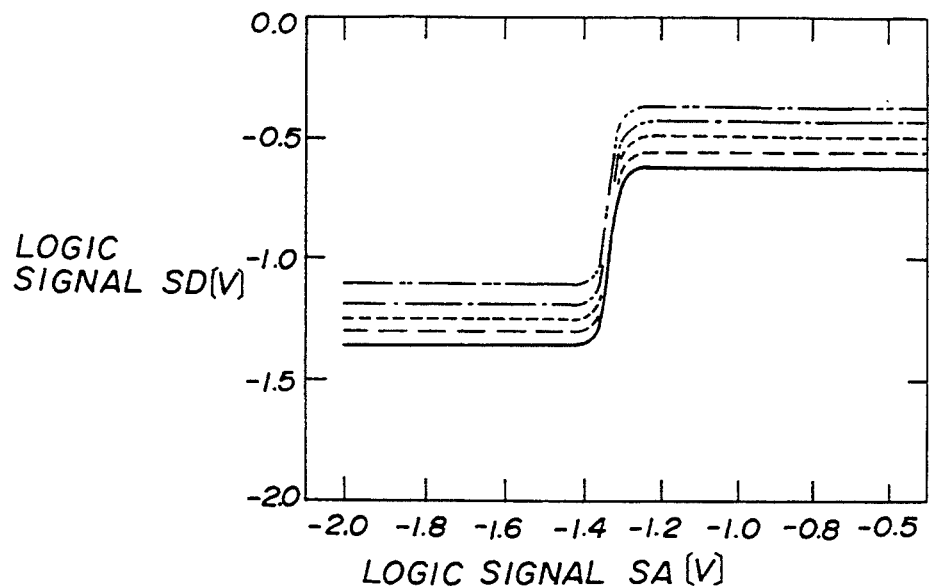
FIG. 7 is a graph showing a power source voltage dependency of a positive phase logic signal output from the input interface circuit of the first embodiment.

FIG. 7 shows a simulation result of the amount of shift of the positive phase logic signal SD which is output from the input interface circuit 37 when the power source voltage $V_{SS2}$ is −2.0 [V] and the power source voltage $V_{SS1}$ deviates, where the abscissa indicates the voltage of the logic signal SA of the ECL level and the ordinate indicates the voltage of the logic signal SD.

Figure 8:
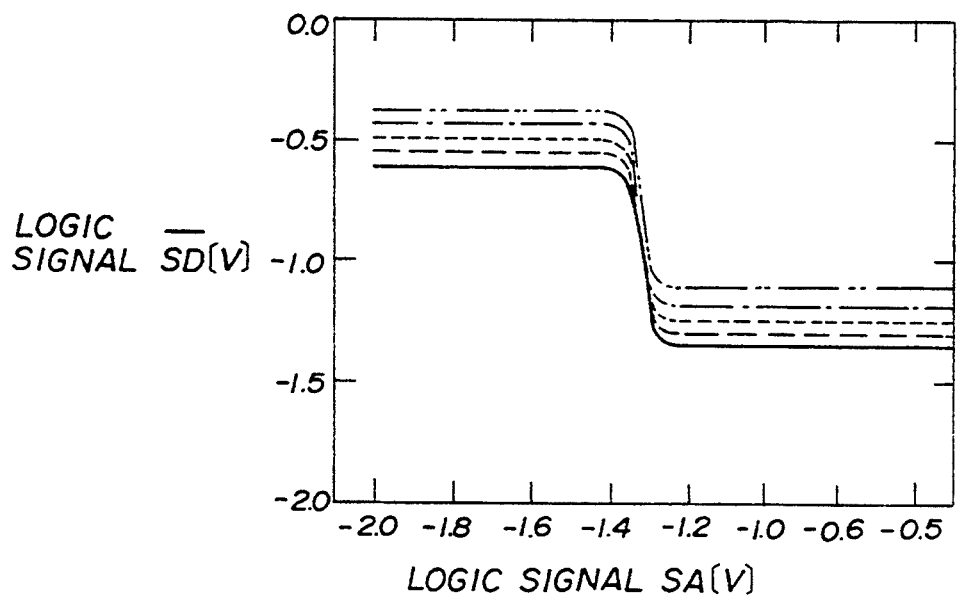
FIG. 8 is a graph showing a power source voltage dependency of an inverted phase logic signal output fro the input interface circuit of the first embodiment.

In FIG. 7 and FIG. 8 which will be described later, a two-dot chain line indicates the simulation result at the power source voltage $V_{SS1} = -1.1$ [V], a one-dot chain line indicates the simulation result at the power source voltage $V_{SS1} = -1.2$ [V], a fine dotted line indicates the simulation result at the power source voltage $V_{SS1} = -1.3$ [V], a coarse dotted line indicates the simulation result at the power source voltage $V_{SS1} = -1.4$ [V], and a solid line indicates the simulation result at the power source voltage $V_{SS1} = -1.5$ [V].

FIG. 8 shows a simulation result of the amount of shift of the inverted phase logic signal $\overline{SD}$ which is output from the input interface circuit 37 when the power source voltage $V_{SS2}$ is −2.0 [V] and the power source voltage $V_{SS1}$ deviates, where the abscissa indicates the voltage of the logic signal SA of the ECL level and the ordinate indicates the voltage of the logic signal $\overline{SD}$.

Therefore, according to this embodiment, it is possible to shift the logic signals SD and $\overline{SD}$ output from the input interface circuit 37 and the threshold voltages VIH and VIL of the input part of the internal circuit 3 in the same direction when the power source voltage $V_{SS1}$ undergoes an absolute or relative deviation in the positive direction with respect to the power source voltage $V_{SS2}$. Thus, even if the power source voltage $V_{SS2}$ devuates, the logic signals SD and $\overline{SD}$ output from the input interface circuit 37 can be transferred correctly to the internal circuit 3. In other words, it is possible to positively avoid an erroneous operation which is caused by an incorrect transfer of the logic signals SD and $\overline{SD}$ to the internal circuit 3.

Figure 9:
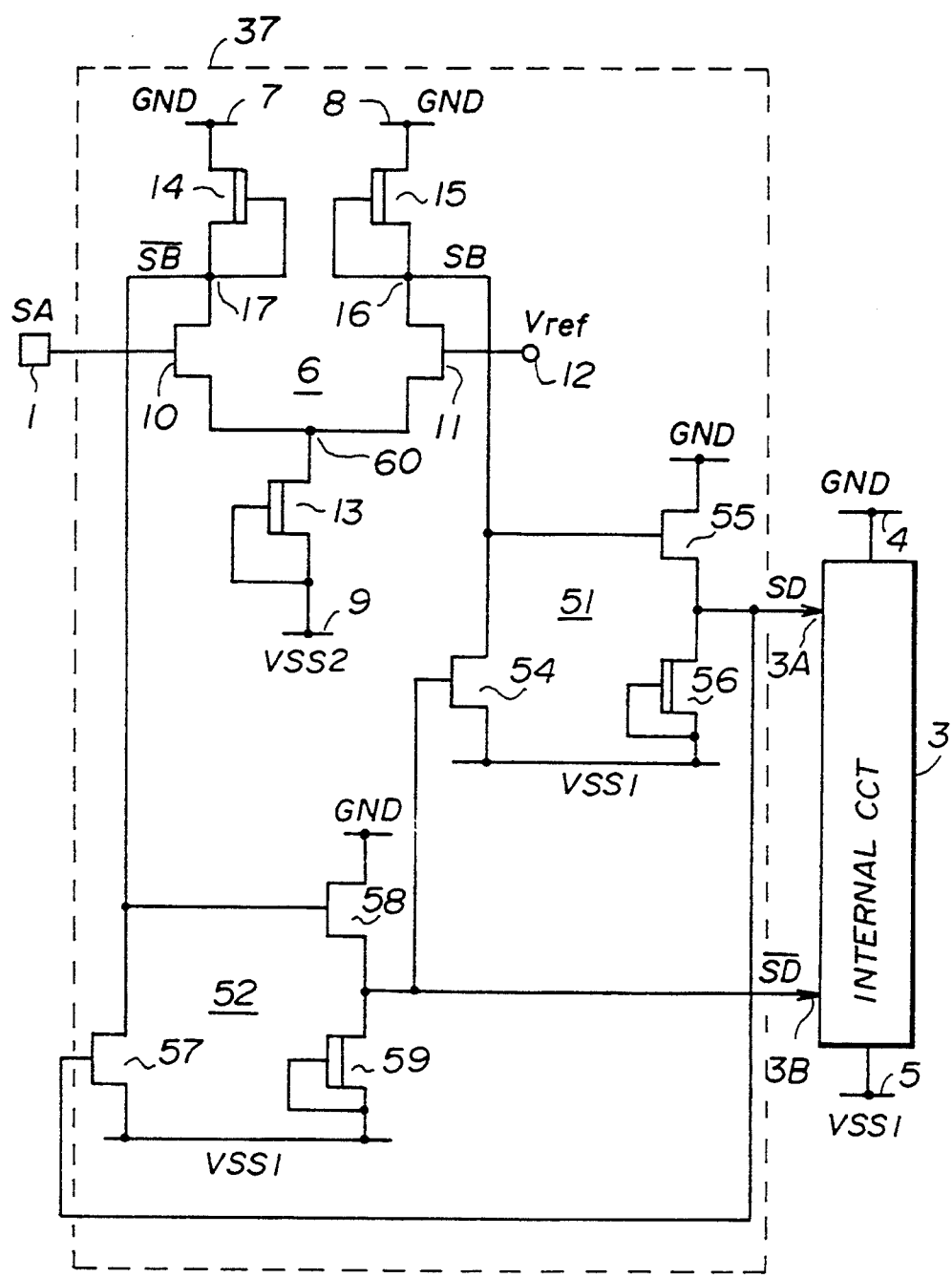
FIG. 9 is a circuit diagram showing an essential part of a second embodiment of the compound semiconductor ingegrated circuit according to the present invention.
Figure 10:
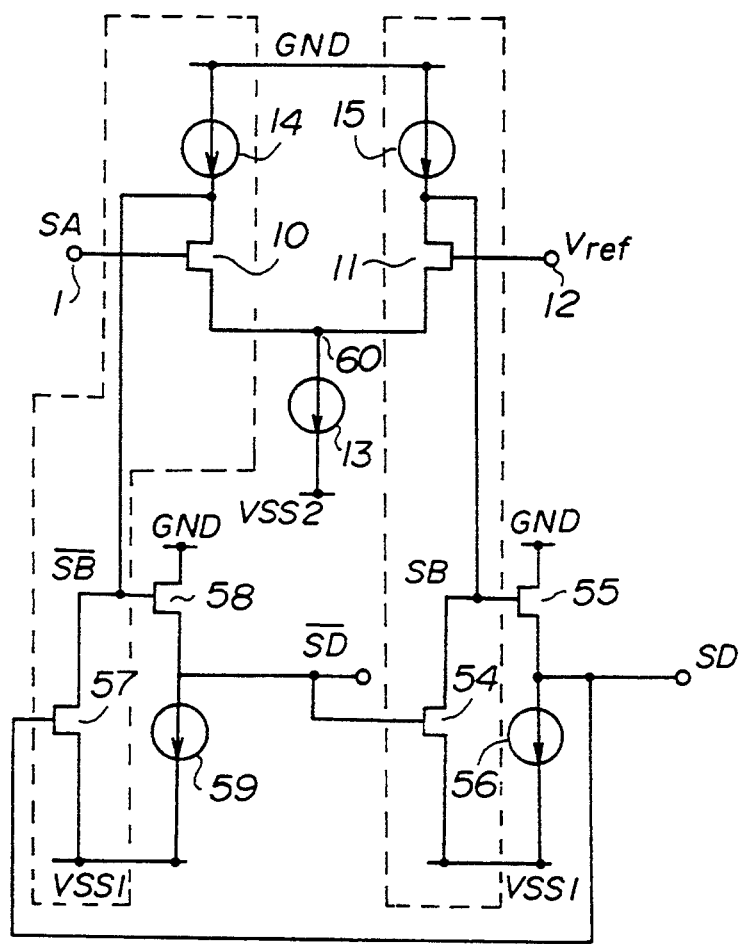
FIG. 10 is a circuit diagram showing an equivalent circuit of the second embodiment for describing the operation thereof.

Next, a description will be given of a second embodiment of the compound semiconductor integrated circuit according to the present invention, by referring to FIGS. 9 and 10. FIG. 9 shows an essential part of the second embodiment, and FIG. 10 shows an equivalent circuit of an essential part of the second embodiment. In FIGS. 9 and 10, those parts which are the same as those corresponding parts in FIG. 4 are designated by the same reference numerals, and a description thereof will be omitted.

In this embodiment, circuits 51 and 52 are provided as shown in FIG. 9 in place of the level conversion circuits 18 and 19 and the push-pull circuits 38 and 39. The circuit 51 includes E-FETs 54 and 55, and a D-FET 56. On the other hand, the circuit 52 includes E-FETs 57 and 58, and a D-FET 59. Hence, the differential amplifier circuit 6 forms an input circuit part of the input interface circuit 37, and the circuits 51 and 52 form an output circuit part of the input interface circuit 37. The logic signal SD is output from a node which connects the E-FET 55 and the D-FET 56, and the logic signal $\overline{SD}$ is output from a node which connects the E-FET 58 and the D-FET 59. For example, the ground voltage GND is 0 [V], the power source voltage $V_{SS1}$ is $-1.6$ [V], and the power source voltage $V_{SS2}$ is $-2.0$ [V].

The D-FET 14 and the E-FET 57 form a level conversion circuit, and the D-FET 15 and the E-FET 54 form another level conversion circuit. Although the D-FET 14 and the E-FET 57 and the D-FET 15 and the E-FET 54 are respectively coupled to mutually different power source voltages $V_{SS2}$ and $V_{SS1}$, the provision of the D-FET 13 which is used as a current source sets a node 60 to a kind of a floating state when the level conversion takes place. That is, the node 60 is maintained to an intermediate level weven if the power source voltage $V_{SS1}$ (or $V_{SS2}$) deviates.

If the logic signal SB has the high level and the logic signal $\overline{SB}$ has the low level, the logic signal SD takes a high level (for example, approximately $-0.9$ [V]) in response to the high level (for example, approximately 0 to $-0.5$ [V]) of the logic signal SD. Hence, the E-FET 57 turns ON resposive to the high-level logic signal SD, and the logic signal $\overline{SB}$ is pulled towards the low level. Accordingly, the transition of the logic signal SB to the high level is accelerated by the low-level logic signal $\overline{SB}$.

The operation for the case where the logic signal SB has the low level and the logic signal $\overline{SB}$ has the high level is similar to the above described case, and a description thereof will be omitted.

The logic signal SA which is applied to the input terminal 1 controls the logic signals SB and $\overline{SB}$. A push-pull circuit means including the E-FETs 54 and 57 accelerates the changes when the logic signals SB and $\overline{SB}$ are controlled.

Figure 12:
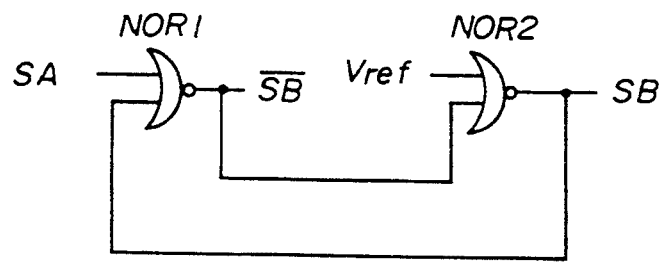
FIG. 12 is a circuit diagram showing an equivalent circuit of the second embodiment.

If the logic signal SA changes from the low level to the high level, the logic signal $\overline{SB}$ takes a low level as is clear from the logic circuit of the second embodiment shown in FIG. 12. In this state, the source potential of the E-FET 11 which receives the reference voltage $V_{ref}$ via the input terminal 12 rises due to the operation of the current source formed by the D-FET 13, and the E-FET 11 turns OFF as a result. In other words, if the logic signal SA changes from the low level to the high level, it appears within the input interface circuit 37 as if the reference voltage $V_{ref}$ changed from the high level to the low level, because the E-FET 11 turns OFF. Of course, the actual reference voltage $V_{ref}$ is fixed and does not change. For this reason, the change of the logic signal SB from the low level to the high level is accelerated by the change of the logic signal $\overline{SB}$ from the high level to the low level and the apparent change of the reference voltage $V_{ref}$ from the high level to the low level. As a result, it is possible to stabilize the logic signals SB and $\overline{SB}$ regardless of the level of the logic signal SA and the apparent level of the reference voltage $V_{ref}$.

Each circuit part surrounded by a dotted line in FIG. 10 functions as a 2-input NOR circuit which is coupled to a source follower, and also functions as a level conversion circuit which carries out a level conversion between the power source voltages $V_{SS1}$ and $V_{SS2}$. In the case of the circuit part surrounded by the dotted line on the left hand side in FIG. 10, for example, the source follower is formed by the E-FET 58 and the D-FET 59 which may be considered as a buffer circuit. In FIG. 10, each D-FET which functions as a current source is indicated as a current source.

Figure 11:
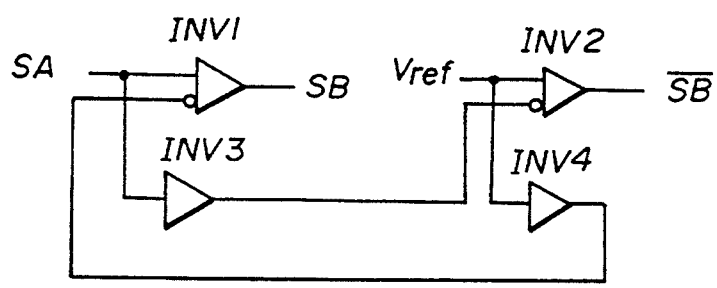
FIG. 11 is a circuit diagram showing an equivalent logic circuit of the first embodiment.

Therefore, an equivalent logic circuit of this embodiment becomes as shown in FIG. 12 compared to an equivalent logic circuit of the first embodiment shown in FIG. 11. The first embodiment is suited for use in a memory such as a RAM, and basically comprises inverters and buffers INV1 through INV4 which are connected as shown in FIG. 11. On the other hand, the second embodiment is suited for use in a register or a latch circuit, and basically comprises two 2-input NOR circuits NOR1 and NOR2. Hence, the second embodiment enables a more easier circuit control compared to the first embodiment.

Figure 13:
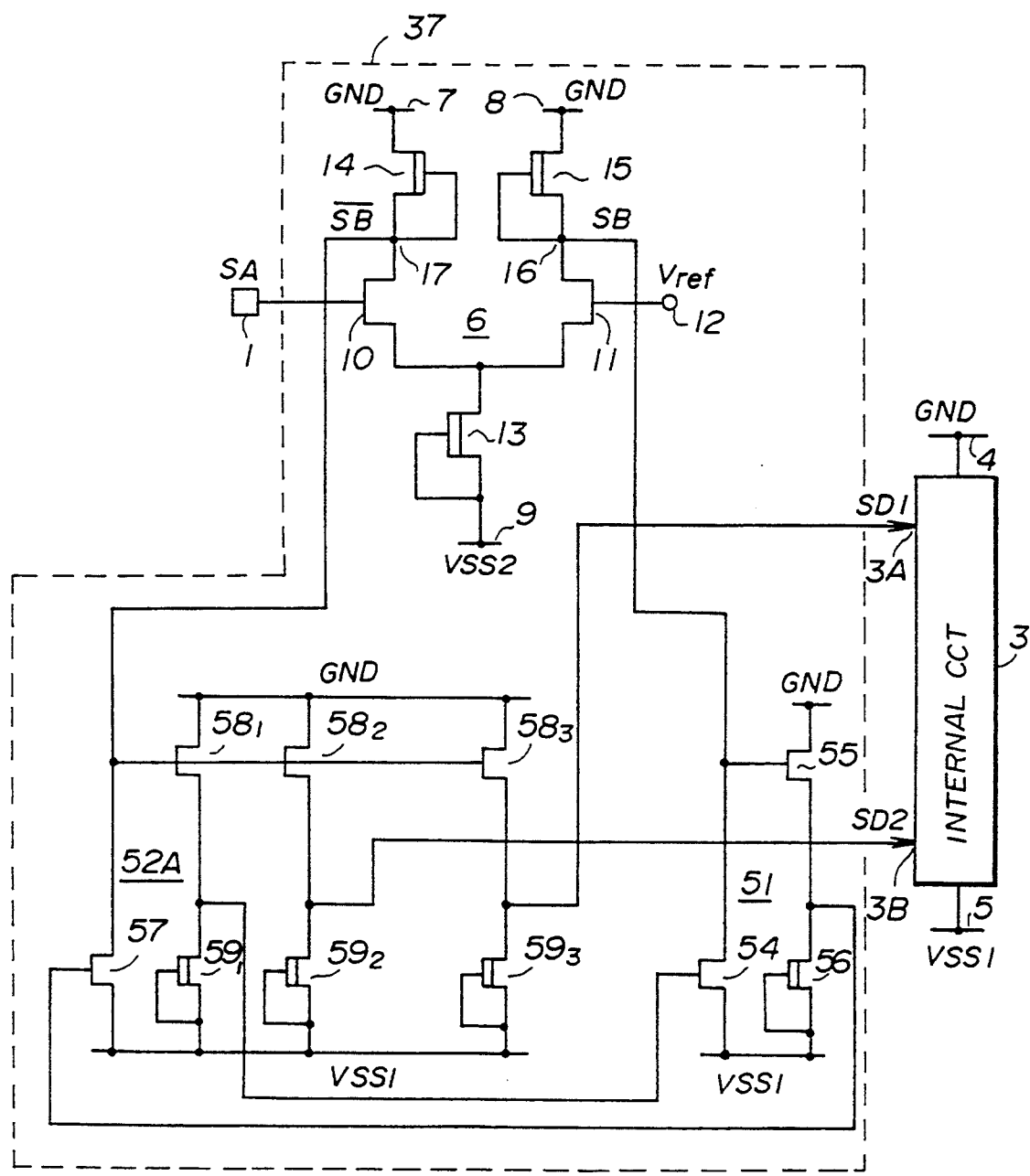
FIG. 13 is a circuit diagram showing an essential part of a third embodiment of the compound semiconductor integrated circuit according to the present invention.

Next, a description will be given of a third embodiment of the compound semiconductor integrated circuit according to the present invention, by referring to FIG. 13. In FIG. 13, those parts which are the same as those corresponding parts in FIG. 9 are designated by the same reference numerals, and a description thereof will be omitted.

In this embodiment, a circuit 52A includes the E-FET 57, E-FETs $58_1$ through $58_3$, and D-FETs $59_1$ through $59_3$. Hence, the circuits 51 and 52A form the output circuit part of the input interface circuit 37. The logic signal SD1 is output from a node which connects the E-FET $58_3$ and the D-FET $59_3$, and the logic signal SD2 is output from a node which connects the E-FET $58_2$ and the D-FET $59_2$.

Compared to the second embodiment which outputs the complementary logic signals SD and $\overline{SD}$, this embodiment outputs logic signals SD1 and SD2. In other wods, the second embodiment outputs an OR output and a NOR output. On the other hand, this embodiment outputs two OR outputs.

Figure 14:
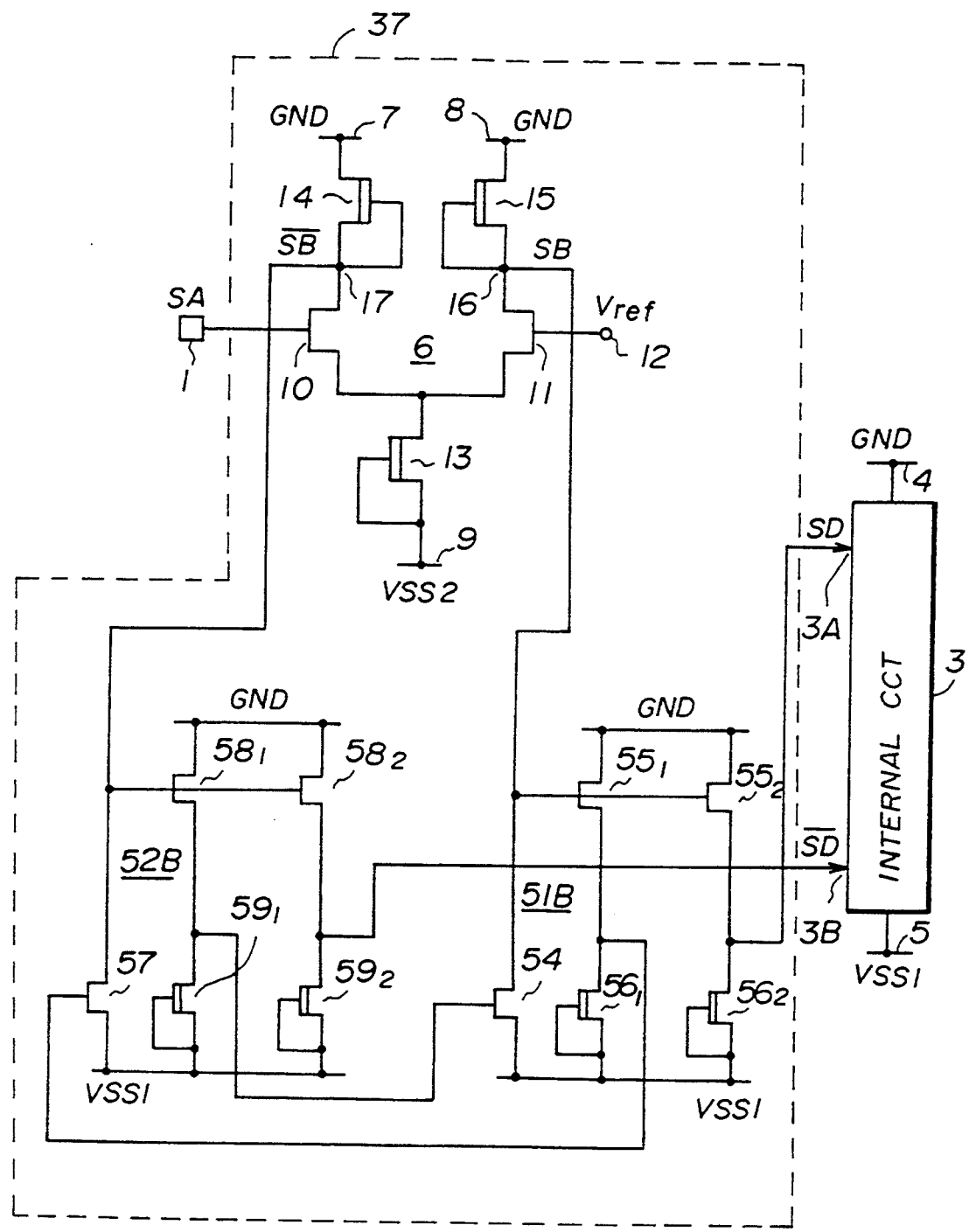
FIG. 14 is a circuit diagram showing an essential part of a fourth embodiment of the compound semiconductor integrated circuit according to the present invention.

Next, a description will be given of a fourth embodiment of the compound semiconductor integrated circuit according to the present invention, by referring to FIG. 14. In FIG. 14, those parts which are the same as those corresponding parts in FIGS. 9 and 13 are designated by the same reference numerals, and a description thereof will be omtited.

In this embodiment, a circuit 51B includes the E-FET 54, E-FETs $55_1$ and $55_2$, and D-FETs $56_1$ and $56_2$. A circuit 52B includes the E-FET 57, E-FETs $58_1$ and $58_2$, and D-FETs $59_1$ and $59_2$. Hence, the circuits 51B and 52B form the output circuit part of the input interface circuit 37. The logic signal SD is output from a node which connects the E-FET $55_2$ and the D-FET $56_2$, and the logic signal $\overline{SD}$ is output from a node which connects the E-FET $58_2$ and the D-FET $59_2$.

In the second embodiment shown in FIG. 9, if the positive phaswe input terminal 3A of the internal circuit 3 is connected to a large load such as a long wiring and thus a large capacitance is conencted to the positive phase input terminal 3A, the large capacitance affects the signal at the inverted phase input terminal 3B of the internal circuit 3. In other words, a mutual interference occurs between the logic signals SD and $\overline{SD}$. This mutual interference occurs because the gate of the E-FET 57 of the circuit 52 which outputs the logic signal $\overline{SD}$ is connected to the output of the circuit 51, that is, the node which connects the E-FET 55 and the D-FET 56 and outputs the logic signal SD. Hence, a waveform distortion of the logic signal SD caused by the large capacitance connected to the positive phase input terminal 3A causes an inevitable delay in the operation of the circuit 52, thereby introducing the mutual interference.

Hence, this fourth embodiment shown in FIG. 14 is designed to eliminate the above described mutual interference. In this embodiment, the source followers are provided in two stages in each of the circuits 51B and 52B, so as to minimize the effects on each other.

In the first through fourth embodiments, the input circuit part of the input interface circuit is made up of a single stage, but it is possible to provide two or more stages of circuits if the gain obtainable by a single stage is insufficient.

Figure 15:
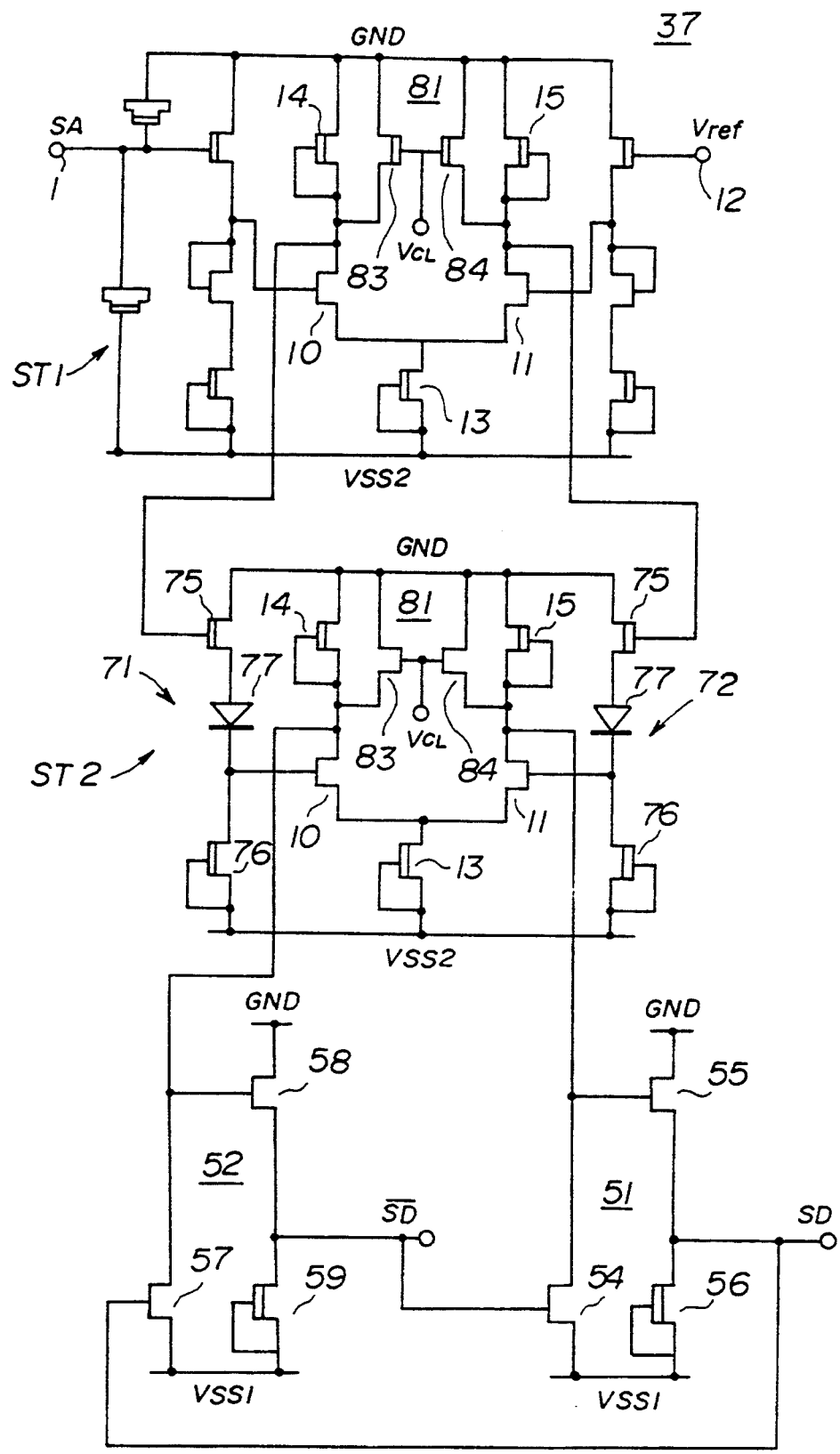
FIG. 15 is a circuit diagram showing an essential part of a fifth embodiment of the compound semiconductor integrated circuit according to the present invention.

FIG. 15 shows an essential part of a fifth embodiment of the compound semiconductor integrated circuit according to the present invention, in which the input circuit part of the input interface circuit is made up of two stages. For the sake of convenience, FIG. 15 shows the two-stage construction applied to the second embodiment, but the two-stage construction is similarly applicable to any of the first through fourth embodiments. In FIG. 15, those parts which are the same as those corresponding parts in FIG. 9 are designated by the same reference numerals, and a description thereof will be omitted.

In FIG. 15, first and second stages ST1 and ST2 of the input circuit part of the input interface circuit 37 have basically the same construction, and thus, a description will only be given of the second stage ST2 of the input circuit part. In FIG. 15, GND=0 [V], $V_{SS1}=-1.6$ [V], and $V_{SS2}=-2.0$ [V]. In addition, the reference voltage $V_{ref}$ is $-1.33$ [V], and a reference voltage $V_{CL}$ is $-1.0$ [V].

In the second stage ST2, level conversion circuits 71 and 72 are provided to match the signal levels in the second stage ST2 with the signal elvels of the first stage ST1, and the first stage ST1 also includes similar level conversion circuits for the same purpose. The level conversion circuits 71 and 72 respectively include D-FETs 75 and 76, and a diode 77. The stage ST2 further includes a clamp circuit 81 which includes E-FETs 83 and 84. The reference voltage $V_{CL}$ is applied to the clamp circuit 81 to clamp the low level in a vicinity of $-1.0$ [V], so as to reduce the signal amplitude to a minimum amplitude which guarantees correct circuit operation and prevents deterioration of the circuit operation speed.

In addition, since the first stage ST1 receives the logic signal SA which changes and the reference voltage $V_{ref}$ which is fixed, the circuit operation of the stage ST1 is not perfectly summetrical. For this reason, the clamp circuits 81 in the frist and second stages ST1 and ST2 also function to average and stabilize the signal levels output from the first and second stages ST1 and ST2.

Figure 17:
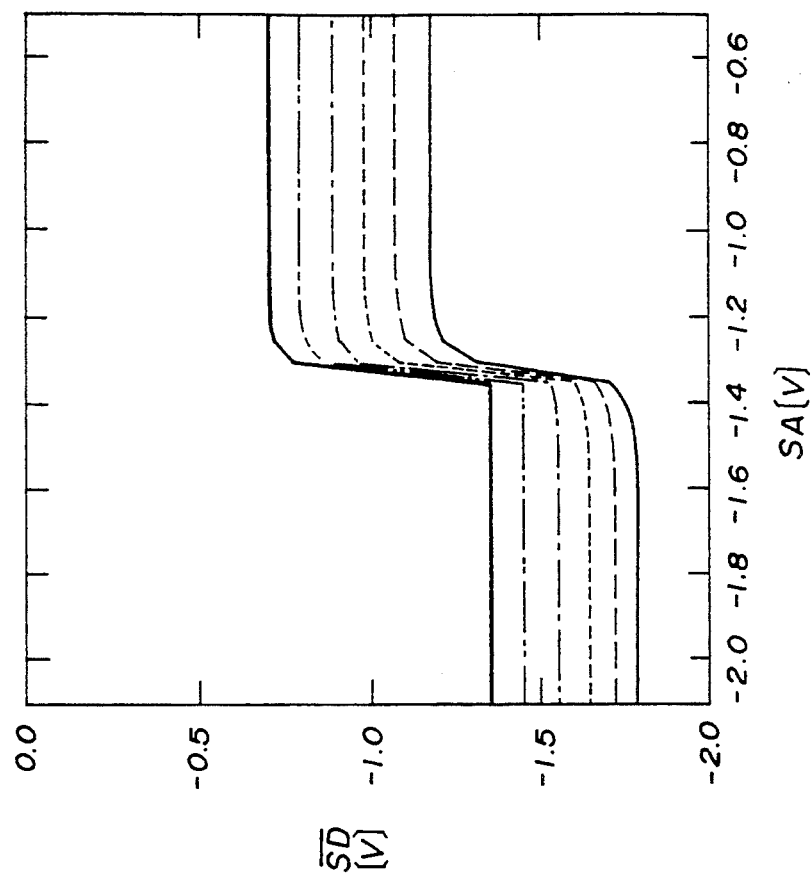
FIGS. 16 and 17 respectively are graphs for explaining the power source voltage dependencies of positive and inverted phase logic signals output fro the input interface circuit of the fifth embodiment for different power source voltages $V_{SS1}$.
Figure 16:
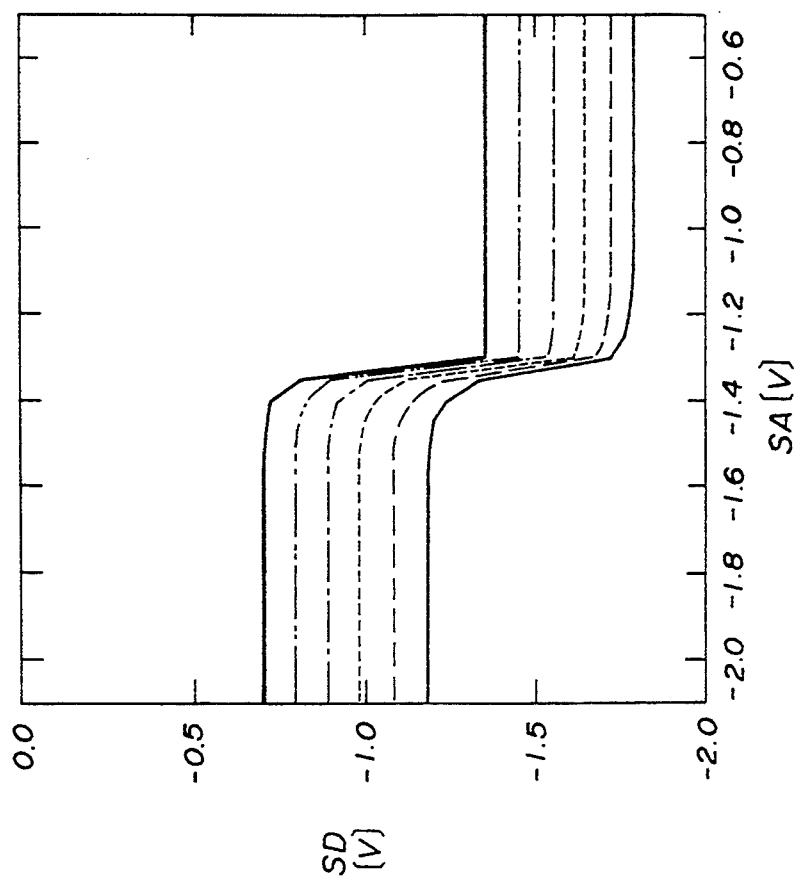

FIGS. 16 and 17 respectively show simulation results for explaining the power source voltage dependencies of positive and inverted phase logic signals SD ad $\overline{SD}$ outout from the input interface circuit 37 of the fifth embodiment for different power source voltages $V_{SS1}$. The simulation results shown in FIGS. 16 and 17 are obtained for the power source voltage $V_{SS2}$ of $-1.8$ [V]. A solid line indicates the simulation result at the power source voltage $V_{SS1}=-1.8$ [V], a coarse dotted line indicates the simulation result at the power source voltage $V_{SS1}=-1.7$ [V], a fine dotted line indicates the simulation result at the power source voltage $V_{SS1}=-1.6$ [V], a one-dot chain line indicates the simulation result at the power source voltage $V_{SS1}=-1.5$ [V], a two-dot chain line indicates the simulation result at the power source voltage $V_{SS1}=-1.4$ [V], and a bold solid line indicates the simulation result at the power source voltage $V_{SS1}=-1.3$ [V].

Figure 19:
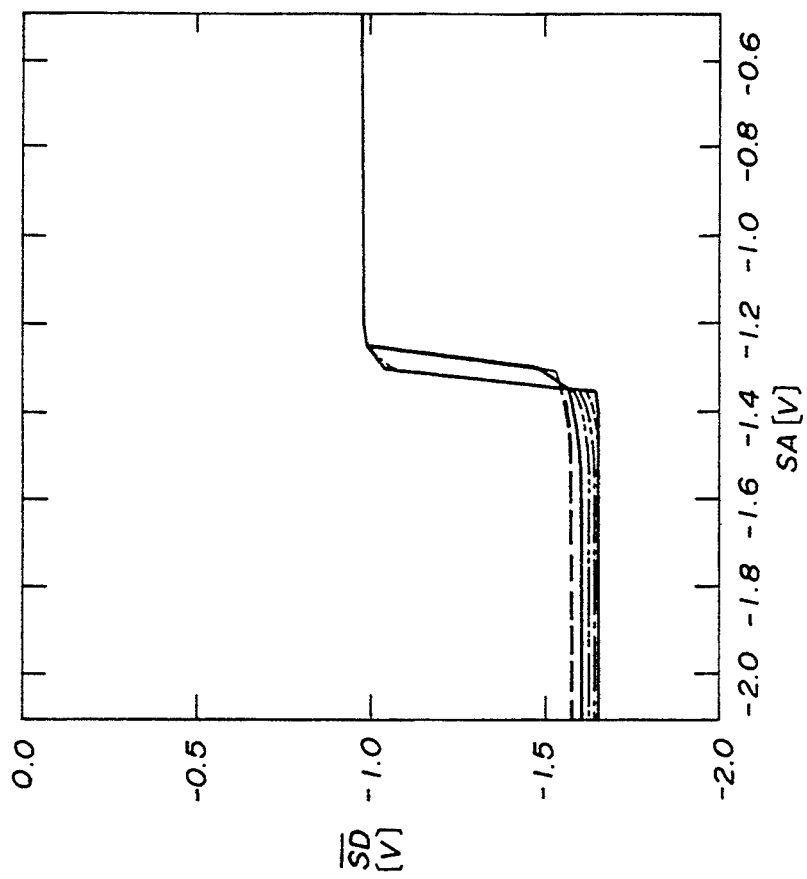
FIGS. 18 and 19 respectively are graphs for explaining the power source voltage dependencies of positive and inverted phase logic signals output from the input interface circuit of the fifth embodiment for different power source voltages $V_{SS2}$.
Figure 18:
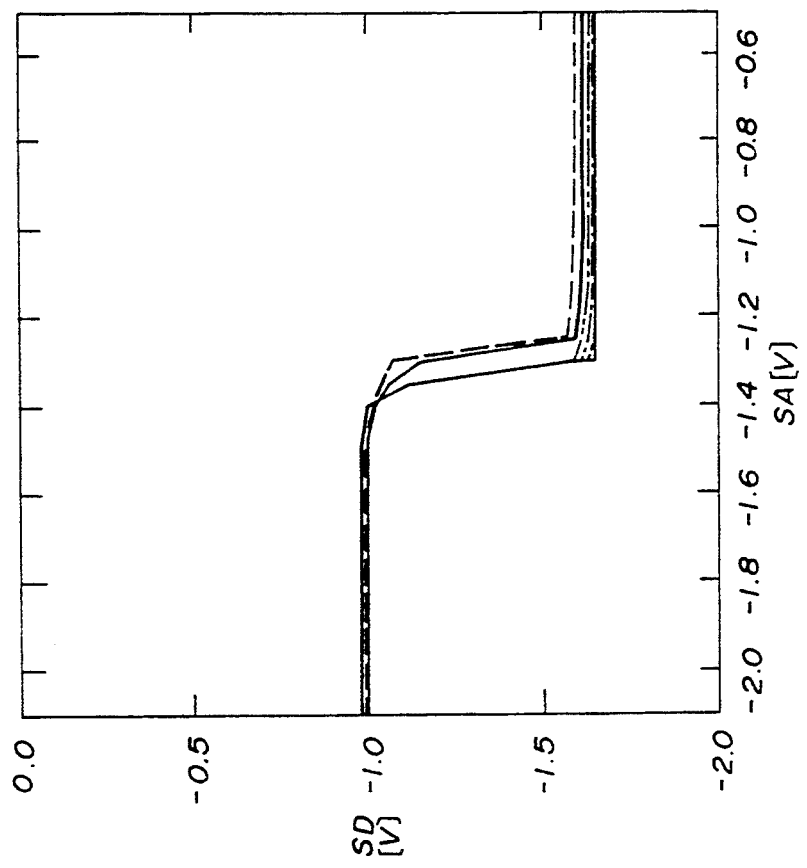

FIGS. 18 and 19 respectively show simulation results for explaining the power source voltage dependencies of positive and inverted phase logic signals SD and $\overline{SD}$ output from the input interface circuit 37 of the fifth embodiment for different power source voltages $V_{SS1}$. The simulation results shown in FIGS. 18 and 19 are obtained for the power source voltage $V_{SS1}$ of $-1.6$ [V]. A solid ilne indicates the simulation result at the power source voltage $V_{SS2}=-2.1$ [V], a coarse dotted line indicates the simulation result at the power source voltage $V_{SS2}=-2.0$ [V], a fine dotted line indicates the simulation result at the power source voltage $V_{SS2}=-1.9$ [V], a one-dot chain line indicates the simulation result at the power source voltage $V_{SS2}=-1.8$ [V], a two-dot chain line indicates the simulation result at the power source voltage $V_{SS2}=-1.7$ [V], a bold solid line indicates the simulation result at the power source voltage $V_{SS2}=-1.6$ [V], and a bold dotted line indicates the simulation result at the power source voltage $V_{SS2}=-1.5$ [V].

Further, the present invention is not limited to these embodiments, but various variations and modifications may be made without departing from the scope of the present invention.

What is claimed is:

1. A compound semiconductor integrated circuit adapted to provide an interface with respect to an internal circuit which is driven by first and second power source voltages and operates responsive to a logic signal having a predetermined logic level which is different from an emitter-coupled logic level, said compound semiconductor integrated circuit comprising:

an input terminal for receiving an input logic signal having the emitter-coupled logic level;

input circuit means, coupled to said input terminal and driven by the first power source voltage and a third power source voltage, for receiving the input logic signal via said input terminal, said input circuit means including a differential amplifier circuit which is driven by the first and third power source voltages, and which outputs positive and inverted phase logic signals in response to the input logic signal; and output circuit means, coupled to said input circuit means and driven by the first and second power source voltages, for converting an output signal of said input circuit means into a signal having the predetermined logic level, said output circuit means including push-pull circuit means, coupled to the differential amplifier circuit and driven by the first and second power source voltages, for generating the output of the output circuit means responsive to the positive and inverted phase logic signals output from the differential amplifier circuit, said second power source voltage being lower than the first power source voltage, said third power source voltage being different from the second power source voltage and being lower than the first power source voltage, said output circuit means supplying an output thereof to the internal circuit.

2. The compound semiconductor integrated circuit as claimed in claim 1, wherein the second and third power source voltages are received from independent power sources.

3. The compound semiconductor integrated circuit as claimed in claim 1, wherein said third power source voltage is lower than the second power source voltage.

4. The compound semiconductor integrated circuit as claimed in claim 1, wherein said input circuit means and said output circuit means are provided on a single semiconductor chip together with the internal circuit.

5. The compound semiconductor integrated circuit as claimed in claim 1, wherein the predetermined logic level is a logic level employed by a GaAs circuit.

6. The compound semiconductor integrated circuit as claimed in claim 1, wherein said output of said output circuit means makes a change which corresponds to a change of threshold values in the internal circuit caused by a deviation of the second power source voltage, so that a logic level of the input logic signal is correctly transferred to the internal circuit regardless of a relative deviation in a difference between the second and third power source voltages.

7. The compound semiconductor integrated circuit as claimed in claim 6, wherein said push-pull circuit means outputs complementary logic signals as the output of said output circuit means in response to the positive and inverted phase logic signals output from the differential amplifier circuit.

8. The compound semiconductor integrated circuit as claimed in claim 7, wherein said push-pull circuit means includes a level conversion circuit, coupled to the differential amplifier circuit, for converting the positive and inverted phase logic signals output from the differential amplifier circuit into positive and inverted phase logic signals having the predetermined logic level, and a push-pull circuit which outputs complementary logic signals as the output of said output circuit means in response to the positive and inverted phase logic signals output from the level conversion circuit.

9. The compound semiconductor integrated circuit as claimed in claim 7, wherein said push-pull circuit means includes a first circuit part for outputting one of the complementary logic signals independently of the other of the complementary output signals, and a second circuit part for outputting the other of the complementary output signals independently of the one of the complementary output signals.

10. The compound semiconductor integrated circuit as claimed in claim 9, wherein the first circuit part outputs a first signal which is input to the second circuit part, and the second circuit part outputs a second signal which is input to the first circuit part.

11. The compound semiconductor integrated circuit as claimed in claim 6, wherein said differential amplifier circuit includes a clamp circuit for clamping a signal level of the positive and inverted phase logic signals to an intermediate level between the first and third power source voltages.

12. The compound semiconductor integrated circuit as claimed in claim 11, wherein said differential amplifier circuit includes a plurality of differential amplifier stages.

* * * * *